US012038858B2

(12) United States Patent
Thakur et al.

(10) Patent No.: US 12,038,858 B2
(45) Date of Patent: Jul. 16, 2024

(54) PROCESSOR PACKAGE WITH UNIVERSAL OPTICAL INPUT/OUTPUT

(71) Applicant: Intel Corporation, Santa Clara, CA (US)

(72) Inventors: Anshuman Thakur, Beaverton, OR (US); Dheeraj Subareddy, Portland, OR (US); Md Altaf Hossain, Portland, OR (US); Ankireddy Nalamalpu, Portland, OR (US); Mahesh Kumashikar, Bangalore (IN); Sandeep Sane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 753 days.

(21) Appl. No.: 17/067,334

(22) Filed: Oct. 9, 2020

(65) Prior Publication Data

US 2022/0114121 A1  Apr. 14, 2022

(51) Int. Cl.
*G06F 13/20* (2006.01)
*G06F 13/40* (2006.01)
*H01L 25/16* (2023.01)

(52) U.S. Cl.
CPC .......... *G06F 13/20* (2013.01); *G06F 2213/40* (2013.01)

(58) Field of Classification Search
CPC .................. G02B 6/4292; H01L 23/5383
See application file for complete search history.

(56) References Cited

U.S. PATENT DOCUMENTS

| 5,331,172 | A | * | 7/1994 | Kumar | H01L 24/11 |
|---|---|---|---|---|---|
| | | | | | 250/398 |
| 10,866,376 | B1 | * | 12/2020 | Ghiasi | G02B 6/4292 |
| 2019/0317287 | A1 | * | 10/2019 | Raghunathan | G02B 6/4274 |
| 2020/0075567 | A1 | * | 3/2020 | Collins | H01L 21/4857 |
| 2020/0296823 | A1 | * | 9/2020 | Kamgaing | H05K 1/0243 |
| 2020/0334196 | A1 | * | 10/2020 | Nassif | G06F 15/7889 |
| 2021/0125882 | A1 | * | 4/2021 | Oh | H01L 23/5383 |

OTHER PUBLICATIONS

Office Action from German Patent Application No. 1 02021121287.1, mailed Jan. 5, 2022, 1 pg.

* cited by examiner

*Primary Examiner* — Getente A Yimer
(74) *Attorney, Agent, or Firm* — Schwabe, Williamson & Wyatt, P.C.

(57) ABSTRACT

A processor package module comprises a substrate, one or more compute die mounted to the substrate, and one or more photonic die mounted to the substrate. The photonic die have N optical I/O links to transmit and receive optical I/O signals using a plurality of virtual optical channels, the N optical I/O links corresponding to different types of I/O interfaces excluding power and ground I/O. The substrate is mounted into a socket that support the power and ground I/O and electrical connections between the one or more compute die and the one or more photonic die.

22 Claims, 6 Drawing Sheets

PROCESSOR PACKAGE WITH UNIVERSAL OPTICAL INPUT/OUTPUT

TECHNICAL FIELD

Embodiments of the disclosure are in the field of integrated circuit structures, and in particular, a processor package with universal optical input/output.

BACKGROUND

Performance in server computer systems is a primarily based on the performance of the processors or CPUs (Central Processing Unit) and the effective bandwidth of the inputs/outputs (I/O). Server CPUs support multiple types of I/Os and memory connectivity. For DRAM, the connectivity type may be DDRx, while for I/O devices the connectivity type may be PCI Express (Peripheral Component Interconnect Express) and universal serial bus (USB). Displays are connected using DisplayPort (DP), and miscellaneous peripherals utilize other simple busses such as (Inter-Integrated Circuit (I2C), System Management Bus (SMBus), Low Pin Count (LPC) bus, and the like. In recent years, clock speeds have been plateauing and additional performance has been extracted by adding more CPUs. This creates a tradeoff between IO and compute.

Each of these different types of I/O and memory interfaces, however, have been optimized for the specific task, and the use of multiple I/O and memory interfaces has resulted in several disadvantages over time due to increased complexity. For example, an increasing number of DDR channels drives extremely large package sizes, requiring the manufacturing of new sockets that require huge investment due to certification for electrical, mechanical, and the like. That is, as more features are added, core areas also increase in size, such as the CPU, memory and I/O. Another problem is that bandwidth on different I/O interfaces is sub-optimally utilized due to hard partitioning based on the type of I/Os (e.g. DDR bandwidth is X, while PCIe bandwidth is Y). Further, additional validation time is required for verification of the different types of I/O. Finally, the use of multiple I/O and memory interfaces requires additional routing for the different I/Os throughout the server board, which adds to design, manufacturing and testing complexities.

DESCRIPTION OF THE EMBODIMENTS

Figure 1A:
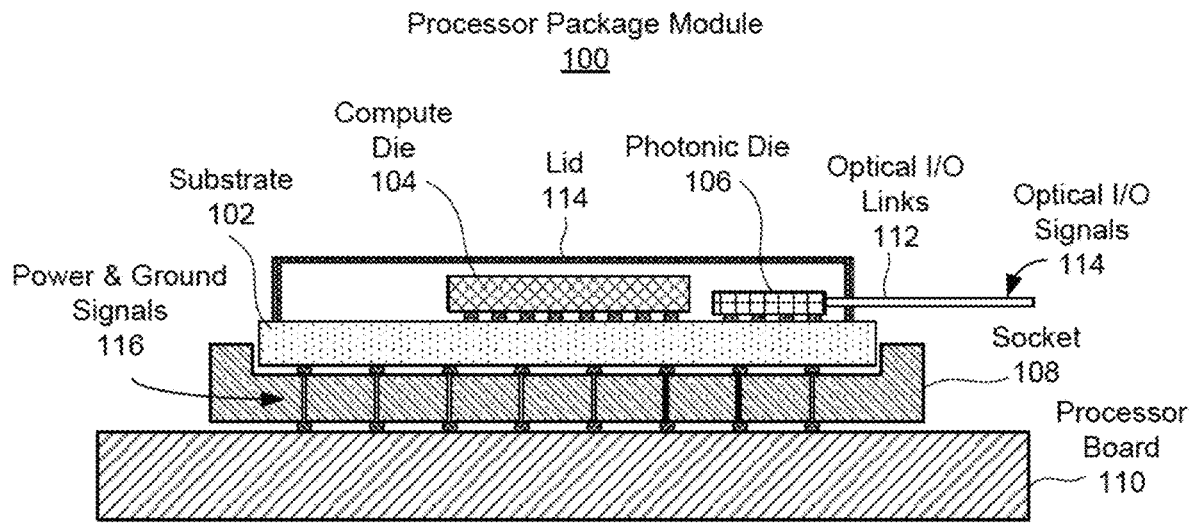
FIG. 1A illustrates a cross-section view of a processor package module.

A processor package with universal optical input/output for a server CPU is described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments of the disclosure are directed to a processor package with universal optical input/output (I/O) for a server CPU. The processor package module co-packages one or more compute die with one or more photonic die on a substrate. The substrate is mounted to a socket, which in turn, is mounted to a processor board. The photonic die transmits and receives optical I/O comprising a plurality of I/O links over a plurality of virtual optical channels. The plurality of I/O links correspond to different types of I/O interfaces, including a memory interface, but exclude power and ground I/O. The socket supports only power and ground I/O and the electrical connections between the compute die and the photonic die.

Accordingly, the processor package module provides a universal I/O definition where all the different types of I/Os defined currently are routed through the photonic die except power and ground. This means the electrical contacts on the socket previously dedicated to different types of I/Os except power and ground may be optionally removed, resulting in a smaller footprint for the socket. The disclosed embodiments provide a processor package with a universal I/O link for a server CPU that drives simplicity in package design, increases compute density, creates a path for faster validation, and enables data center architectures that share I/Os and the like for better total cost of ownership (TCO). The universal optical input/output for a server CPU may be applicable to high-performance high-bandwidth computing, and scalable architectures to provide high-bandwidth connectivity.

Figure 1B:
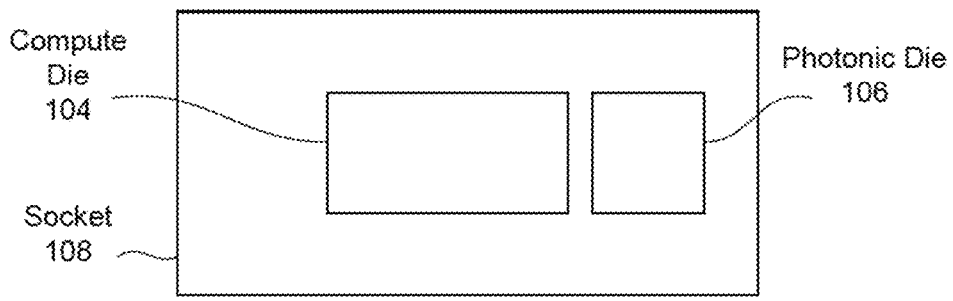
FIG. 1B illustrates a top view of the processor package module.

FIG. 1A illustrates a cross-section view of a processor package module, and FIG. 1B illustrates a top view of the processor package module in accordance with one or more embodiments. Referring to both FIGS. 1A and 1B, the processor package module 100 includes one or more compute die 104 and one or more the photonic die 106 mounted to a substrate 102. For example, in one embodiment, the photonic die 106 may provide a Terabit/s optical physical layer to support high-bandwidth, low-latency connectivity.

In embodiments, an optional lid 114 or a heat shield may be placed over the compute die 104 and in some embodiments the photonic die 106. In embodiments, the compute die 104 and the photonic die 106 exchange electrical signals through surface mounted interconnects, interconnects embedded into the substrate 102, or a combination of both. Any type of substrate known in the art may be used. For example, an organic substrate, an inorganic substrate (e.g., ceramic substrate, silicon substrate, etc.), a combination of an organic substrate and an inorganic substrate, etc. In another embodiment, the substrate 102 may comprise an optical backplane, an interposer, a ball grid array (BGA) board or an embedded multi-die interconnect bridge (EMIB) for example.

The substrate 102 may be mounted to one side of the socket 108 through microbumps, or large pitch bumps, and the opposite side of the socket 108 may be mounted to a processor board 110. In one embodiment, the socket 108 may comprise a land grid array (LGA) socket. In one embodiment, processor board 110 may comprise a PCB, an EMIB or an interposer, for example.

According to the disclosed embodiments, the photonic die 106 is connected to the compute die 104 through the substrate 102. The photonic die 106 is connected to external components through N optical I/O links 112 that transmit and receive optical I/O 114 signals using a plurality of virtual optical channels, where the plurality of optical I/O links correspond to different types of I/O interfaces excluding power and ground I/O. In one embodiment, the optical I/O links 112 may be implemented using an optical fiber cable or a fiber array (and corresponding connectors). The socket 108 is configured to support transmission of only power and ground I/O signals 116 and electrical connections between the compute die 104 and the photonic die 106.

Accordingly, the processor package module 100 provides a universal I/O definition where all the different types of currently defined I/Os are routed through the photonic die 106 and optical I/O links 112 except power and ground. This means the electrical contacts on the socket previously dedicated to different types of I/Os except power and ground may be optionally removed, resulting in a smaller footprint for the socket. For example, up to 5000 pins may be removed from conventional LGA socket used for server CPUs. The disclosed embodiments provide a simplified CPU architecture that does not compromise on performance and is easy to validate, fabricate and maintain. This furthermore builds a natural path to share I/O pools and bandwidths.

In further detail, the optical I/O links 112 may be top or bottom-side coupled or edge coupled to the photonic die 106. The photonic die 106 may comprise a transceiver and a plurality of optical waveguides may be disposed on a substrate within photonic die 106. Such optical waveguides are each further coupled into a photodetector, such as, but not limited to, a p-i-n photodiode, and/or coupled to laser emitters. The photodetector/lasers are in turn electrically coupled to downstream integrated circuitry, which may for example further include a voltage supply and sense/drive circuitry. In certain embodiments, voltage supply and sense/drive circuitry may be implemented with transistors also disposed on a same silicon substrate implementing the waveguides. Electrical I/O from the sense/drive circuitry interfaces to the substrate 102 through contacts of a socket assembly.

Figure 1C:
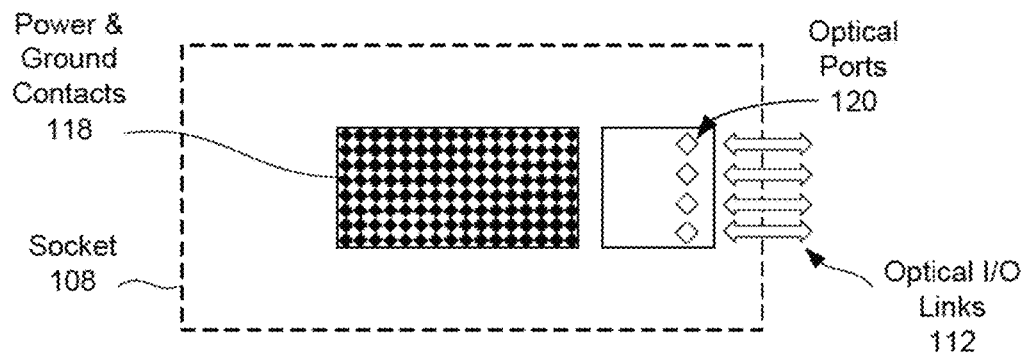
FIGS. 1C and 1D illustrate bottom views of the processor package module mounted to the socket.
Figure 1D:
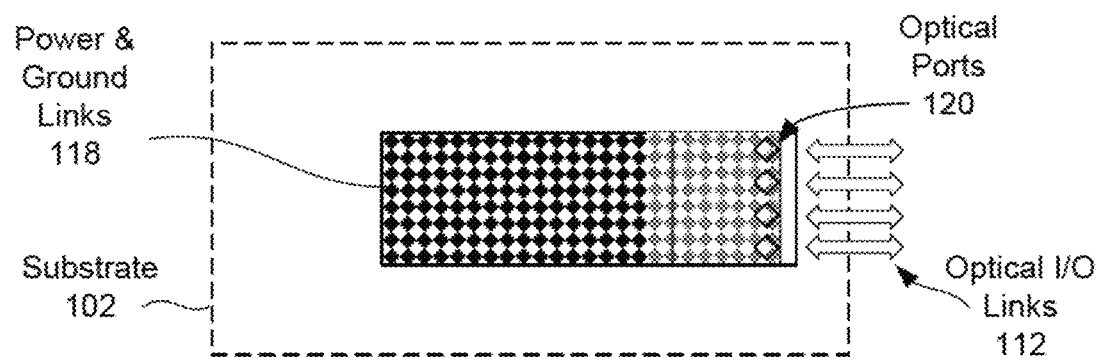

FIGS. 1C and 1D illustrate bottom views of the processor package module 100 mounted to the socket 108, where the socket 108 and substrate 102 are transparent to show the bottom sides of the compute die 104 and the photonic die 106. The bottom side of the socket 108 faces the main board 110 and includes a plurality of electrical power and ground contacts 118 dedicated to transmitting the power and ground signals 116. In one embodiment, the socket 108 does not include any other electrical contacts dedicated to the plurality of optical I/O links corresponding to different types of I/O interfaces. In another embodiment, the socket 108 may include electrical contacts dedicated to the plurality of I/O links corresponding to different types of I/O interfaces, but the electrical contacts are inactive.

As shown in FIG. 1C, the power and ground contacts 118 may be in an area of the socket 108 located directly beneath the compute die 104. As shown in FIG. 1D, in another embodiment, the power and ground contacts 118 may be in an area of the socket 108 located below the compute die 104 and the photonic die 108. The power and ground contacts 118 below the photonic die 108 are shown semitransparent so that photonic die 108 is viewable.

FIGS. 1C and 1D also show an embodiment where the photonic die 106 includes optical ports 120 located on the bottom of the photonic die 106. However, in another embodiment, the optical ports may be located on top or an edge, of the photonic die 106.

Figure 2A:
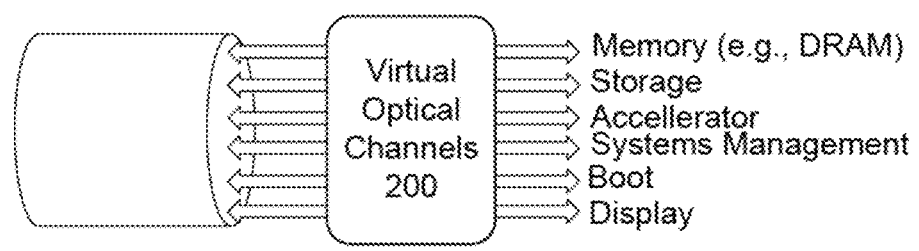
FIG. 2A is a diagram illustrating a representation of the virtual optical channels.

FIG. 2A is a diagram illustrating a representation of the virtual optical channels. In one embodiment, the virtual optical channels 200 of the N optical I/O links 112 corresponding to different types of I/O interfaces may transmit optical I/O signals for the compute die 104 of FIG. 1A for memory signals (e.g., DRAM), storage signals, accelerator signals, system management signals, boot signals, display signals, and any combination thereof.

Figure 2B:
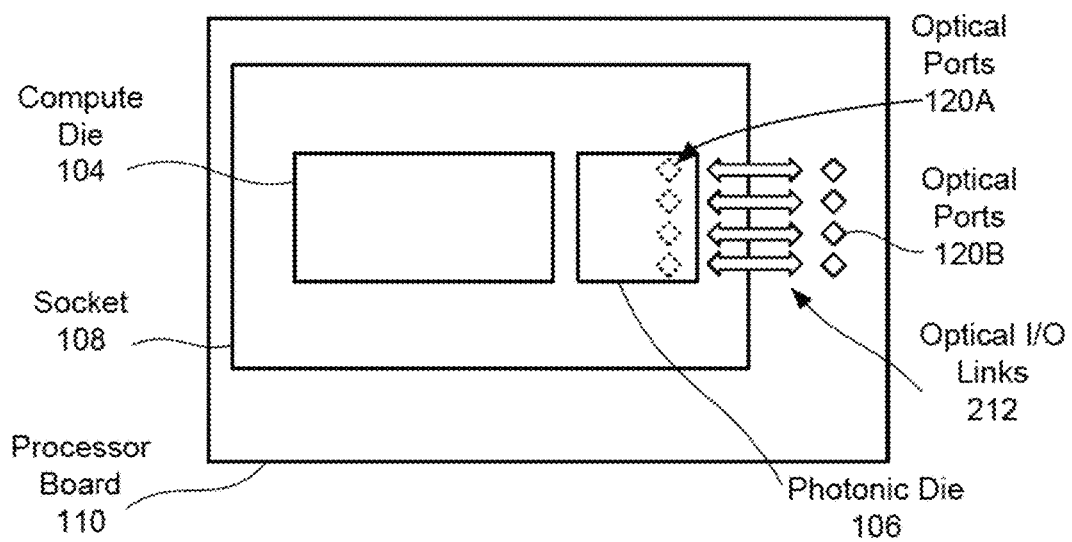
FIGS. 2B and 2C are diagrams illustrating top views of the socket mounted to the processor board.
Figure 2C:
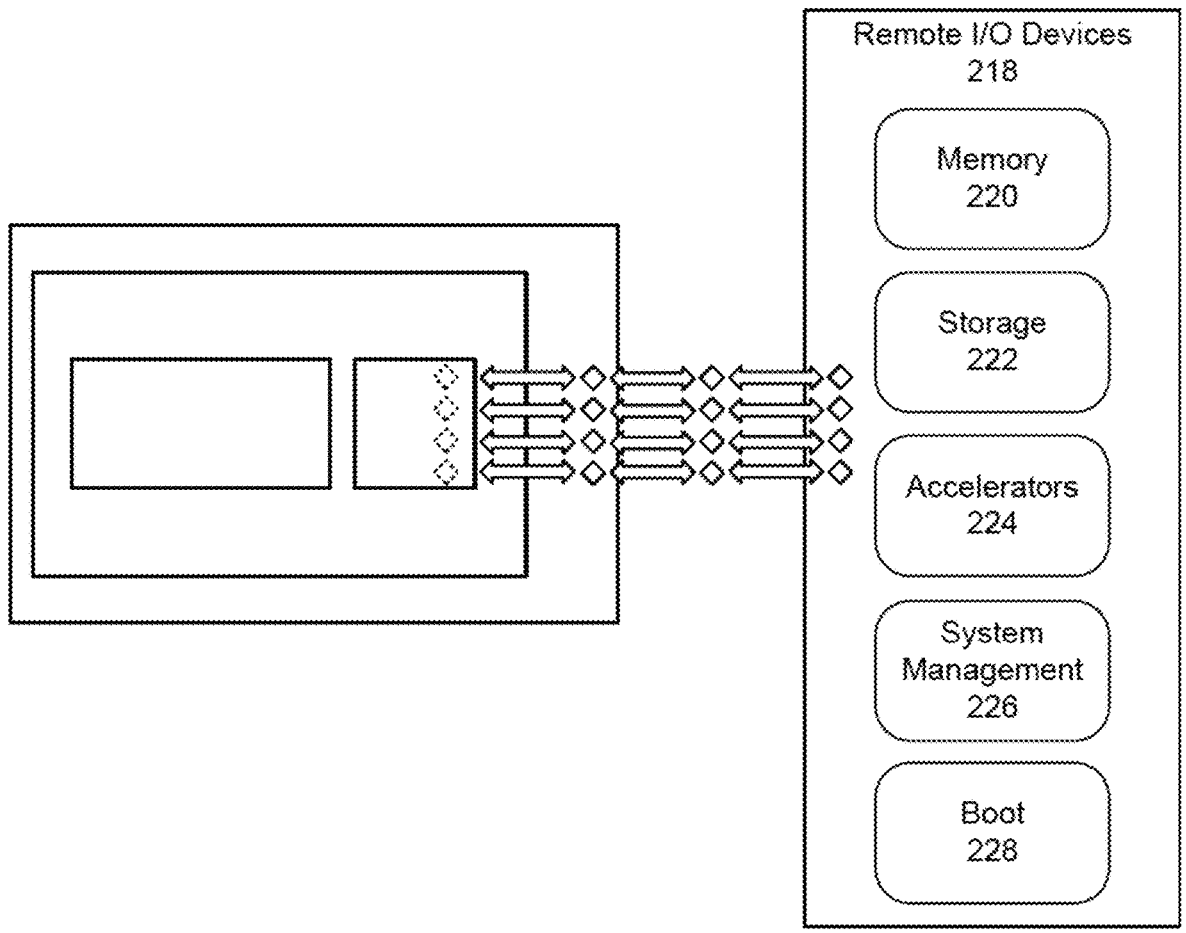

FIGS. 2B and 2C are diagrams illustrating top views of the socket 108 mounted to the processor board 110. The photonic die 106 includes a set of optical ports 120A and the processor board 110 includes embedded optical I/O links 212 and a set of optical ports 120B located on an edge of the processor board 110 to pass the optical I/O signals from the socket 108 to the edge of the processor board 110. The edge of the processor board 110 may also include standard connectors to connect the optical I/O links to external components within a data center. In the example of FIG. 2B, the optical ports 120A of the photonic die 106 are shown located on a bottom of the photonic die, while the optical ports 120B of the processor board 110 are shown located on top of the processor board 110. In one embodiment, the optical ports 120A and 120B may utilize physical guides to align the optical I/O links 112 such that the compute die 104 and the socket 108 are in alignment. This embodiment may further include calibration steps to align the optics, which is outside the scope of this disclosure.

FIG. 2C also shows that the optical I/O links may be relayed from the processor board across multiple sets of optical ports to remote optically connected I/O devices 218. The remote I/O devices 218 may be located on a backside of the processor board or on a separate I/O board located in a server rack, for example. The remote I/O devices 218 provide all I/O functionality and may include any combination of a memory devices (e.g., DRAMs) 220, storage devices 222, accelerator devices (e.g., FPGAs and GPUs) 224, system management controllers 226, and system boot devices 228. The optical I/O links to the remote optically connected I/O devices 218 may be dedicated to the socket 108, a server or a rack, or can be shared. The TCO benefit is realized when the I/O pool is shared between multiple servers. To improve reliability and a failure profile, the remote optically connected I/O devices 218 may be replicated to build redundancy.

Figure 3:
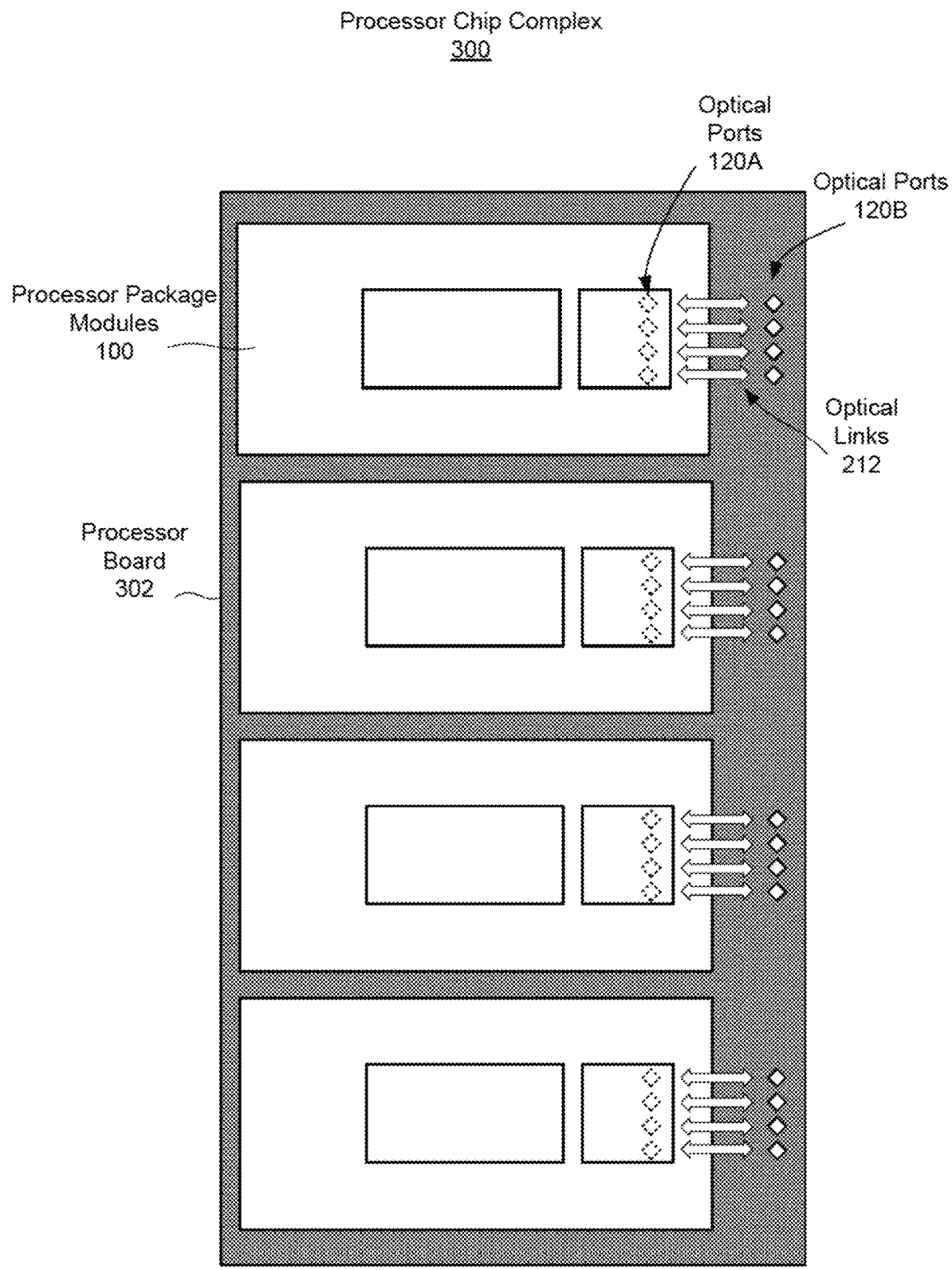
FIG. 3 is diagram illustrating a top view of a processor chip complex.

FIG. 3 is a diagram illustrating a top view of a processor chip complex. The processor chip complex 300 comprises a plurality of optically connected processor package modules 100 mounted to the processor board 302. In this embodiment, the processor board 302 may be implemented as a sled or other form factor. In some embodiments, the processor board 302 may also incorporate an optical switch (not shown) between the processor package modules 100 and sets of optical ports 120B located on an edge of the processor board. Due to the simplicity of the design, the processor package modules 100 can be arranged in an extremely dense configuration to provide a scalable high-density computer system.

FIG. 3 shows an example of four processor package modules 100, but any number of processor package modules 100 may be added to scale to a very large processor system with various levels of performance depending on the number of processor package modules 100 used. It should be understood that each of the processor package modules 100 are separately testable for validation prior to mounting on the processor board 302. In this regard, since the processor package modules 100 are socketed, the processor package modules 100 are easily field replaceable. In addition, the processor package modules 100 may be designed to be reused in existing LGA sockets.

Figure 4:
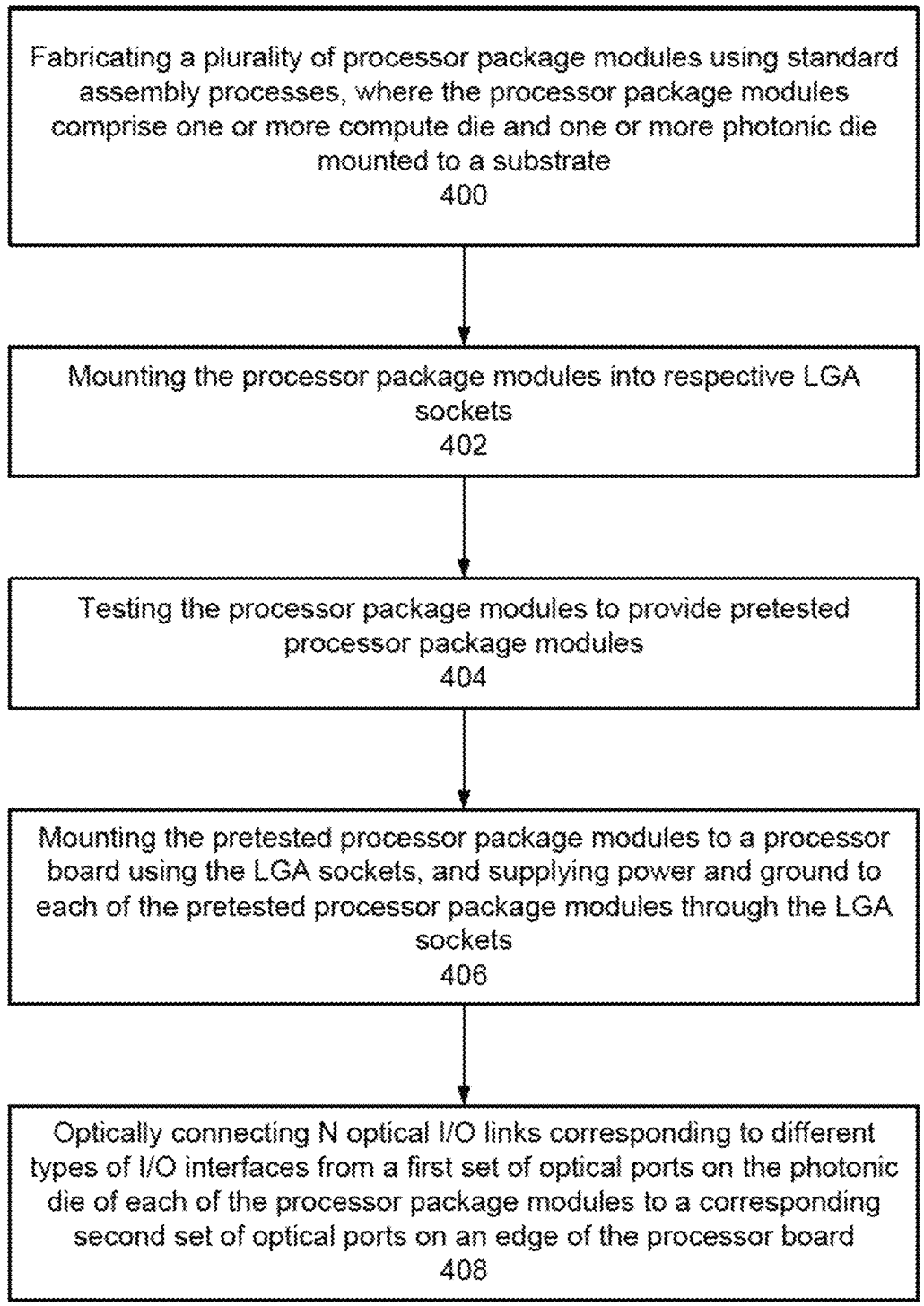
FIG. 4 is a diagram illustrating a process flow for fabricating a processor chip complex in accordance with an embodiment of the present disclosure.

As an exemplary processing scheme involving fabrication of a scalable high-performance processor chip complex package architecture comprising a plurality of processor package modules, refer to FIG. 4.)

FIG. 4 is a diagram illustrating a process flow for fabricating a processor chip complex in accordance with an embodiment of the present disclosure. The process may begin by fabricating a plurality of processor package modules using standard assembly processes, where ones of the processor package modules comprise one or more compute die and one or more photonic die mounted to a substrate (block 400). The processor package modules are mounted into respective LGA sockets (block 402). Before and/or after the processor package modules are mounted to the LGA sockets, the processor package modules are tested to provide pretested processor package modules (block 404). Any type of standard testing procedures may be performed such as stress testing, performance testing, electrical testing, and the like. The pretested processor package modules are mounted to the processor board in a plurality using the LGA sockets, and power is supplied to each of the pretested processor package modules through the LGA sockets (block 406). N optical I/O links corresponding to different types of I/O interfaces are optically connected from a first set of optical ports on the photonic die of each of the processor package modules to a corresponding second set of optical ports on an edge of the processor board (block 408). The processor chip complex is then tested. Before or after testing, optical fiber connections are made between the second set of optical ports on an edge of the processor board to remote I/O devices external to the processor chip complex. A method has been described for fabricating a processor chip complex that is co-packaged with a plurality of processor package modules, each having universal optical I/O.

Figure 5:
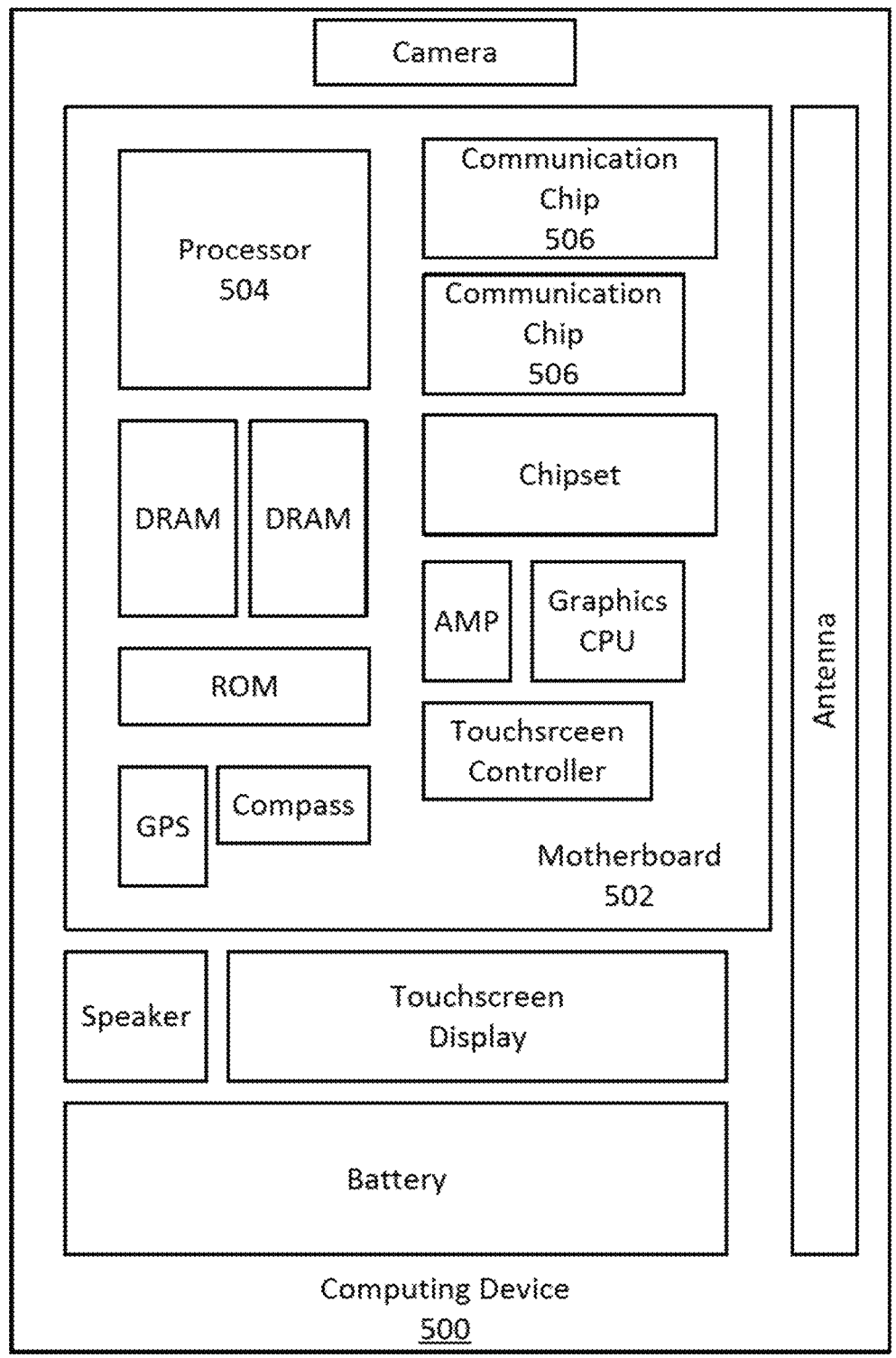
FIG. 5 illustrates a computing device in accordance with one implementation of the disclosure.

FIG. 5 illustrates a computing device 500 in accordance with one implementation of the disclosure. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others. The communication chip 506 includes an integrated circuit die packaged within the communication chip 506

The processor 504 of the computing device 500 includes an integrated circuit die packaged within the processor 504. In some implementations of the disclosure, the processor 504 may comprise processor chip complex in accordance with implementations of embodiments of the disclosure. The term "processor" may refer to any device or portion of a device that processes electronic data from registers and/or memory to transform that electronic data into other electronic data that may be stored in registers and/or memory.

In further implementations, another component housed within the computing device 500 may contain processor chip complex in accordance with implementations of embodiments of the disclosure.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Thus, embodiments described herein include a scalable high-performance package architecture using a processor package with universal optical input/output.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A processor package module comprises a substrate, one or more compute die mounted to the substrate, and one or more photonic die mounted to the substrate. The photonic die have N optical I/O links to transmit and receive optical I/O signals using a plurality of virtual optical channels, the N optical I/O links corresponding to different types of I/O interfaces excluding power and ground I/O. The substrate is mounted into a socket that support the power and ground I/O and electrical connections between the one or more compute die and the one or more photonic die.

Example embodiment 2: The processor package module of embodiment 1, wherein plurality of virtual optical channels carry memory signals, storage signals, accelerator signals, system management signals, boot signals, and display signals.

Example embodiment 3: The processor package module of embodiment 1 or 2, wherein a bottom side of the socket includes electrical power and ground contacts.

Example embodiment 4: The processor package module of embodiment 1, 2 or 3, wherein the socket does not include any electrical contacts dedicated to the plurality of I/O links corresponding to different types of I/O interfaces.

Example embodiment 5: The processor package module of embodiment 1, 2 or 3, wherein the socket includes electrical contacts dedicated to the plurality of I/O links corresponding to different types of I/O interfaces, but the electrical contacts are inactive.

Example embodiment 6: The processor package module of embodiment 1, 2 or 3, wherein the electrical power and ground contacts are located in an area of the socket located directly beneath the one or more compute die.

Example embodiment 7: The processor package module of embodiment 1, 2, 3, 4, 5 or 6 wherein the electrical power and ground contacts are in an area of the socket located below the one or more compute die and the one or more photonic die.

Example embodiment 8: The processor package module of embodiment 1, 2, 3, 4, 5, 6 or 7 wherein one or more photonic die each include optical ports.

Example embodiment 9: The processor package module of embodiment 1, 2, 3, 4, 5, 6, 7 or 8, wherein the optical ports are on a bottom of the one or more photonic die.

Example embodiment 10: The processor package module of embodiment 1, 2, 3, 4, 5, 6, 7 or 8, wherein the optical ports are on a top or an edge of the one or more photonic die.

Example embodiment 11: The processor package module of embodiment 1, 2, 3, 4, 5, 6, 7, 8, 9 or 10 wherein the socket comprises a land grid array (LGA) socket.

Example embodiment 12: A processor chip complex comprises a processor board and a plurality of processor package modules mounted to the processor board. Ones of the processor package modules comprises a substrate, one or more compute die mounted to the substrate, and one or more photonic die mounted to the substrate. The one or more photonic die have N optical I/O links to transmit and receive optical I/O signals using a plurality of virtual optical channels, the N optical I/O links corresponding to different types of I/O interfaces excluding power and ground I/O. The substrate is mounted in a socket, and the socket mounts a corresponding one of the processor package modules to a front side of the processor board. The socket supports only the power and ground I/O and electrical connections between the one or more compute die and the one or more photonic die.

Example embodiment 13: The processor chip complex of embodiment 12, wherein the socket comprises a land grid array (LGA) socket.

Example embodiment 14: The processor chip complex of embodiment 12 or 13, wherein the virtual optical channels of the N optical I/O links corresponding to different types of I/O interfaces transmit optical I/O signals for the compute die for any combination of memory signals, storage signals, accelerator signals, system management signals, boot signals, and display signals.

Example embodiment 15: The processor chip complex of embodiment 12, 13, or 14 wherein the one or more photonic die includes a first set of optical ports and the processor board include embedded optical links and a second set of optical ports located on an edge of the processor board to pass the optical I/O signals from the socket to the edge of the processor board.

Example embodiment 16: The processor chip complex of embodiment 12, 13, 14 or 15 wherein the optical I/O links are relayed from the processor board across multiple sets of optical ports to remote optically connected I/O devices.

Example embodiment 17: The processor chip complex of embodiment 16, wherein the remote optically connected I/O devices include any combination of a memory device, a storage device, an accelerator device, a system management controller, and a system boot device.

Example embodiment 18: The processor chip complex of embodiment 16, wherein the optical I/O links relayed to the remote optically connected I/O devices are dedicated to one of the socket, a server or a rack.

Example embodiment 19: The processor chip complex of embodiment 16, wherein the optical I/O links relayed to the remote optically connected I/O devices are shared between multiple servers.

Example embodiment 20: The processor chip complex of embodiment 12, 13, 14, 15, 16, 17, 18 or 19 further comprising an optical switch between the processor package modules and sets of optical ports located on an edge of the processor board.

Example embodiment 21: A method of fabricating a patch structure comprising: fabricating a plurality of processor package modules using standard assembly processes, where ones of the processor package modules comprise one or more compute die and one or more photonic die mounted to a substrate. The processor package modules are mounted into respective LGA sockets. The processor package modules are tested to provide pretested processor package modules. The pretested processor package modules are mounted a processor board using the LGA sockets, and power is supplied to each of the pretested processor package modules through the LGA sockets. N optical I/O links corresponding to different types of I/O interfaces are connected from a first set of optical ports on the photonic die of each of the processor package modules to a corresponding second set of optical ports on an edge of the processor board.

Example embodiment 22: The method of embodiment 21, further comprising testing the processor chip complex.

Example embodiment 23: The method of embodiment 21 or 22, further comprising before or after testing, making optical fiber connections between the second set of optical ports on the edge of the processor board to remote I/O devices external to the processor chip complex.

Example embodiment 24: The method of embodiment 21, 22 or 23, further comprising sharing the N optical I/O links relayed to the remote I/O devices between multiple servers.

What is claimed is:

1. A processor package module, comprising:
    a substrate;
    one or more compute die mounted to a first side of the substrate;
    one or more photonic die mounted to the first side of the substrate, the one or more photonic die having N optical I/O links to transmit and receive optical I/O signals using a plurality of virtual optical channels, the N optical I/O links corresponding to different types of I/O interfaces, excluding power and ground I/O, wherein the plurality of virtual optical channels carry memory signals, storage signals, accelerator signals, system management signals, boot signals, and display signals; and
    a socket onto which a second side of the substrate is mounted, the socket supporting the power and ground I/O and electrical connections between the one or more compute die and the one or more photonic die.

2. The processor package module of claim 1, wherein second side of the socket includes electrical power and ground contacts.

3. The processor package module of claim 2, wherein the socket does not include any electrical contacts dedicated to the plurality of I/O links corresponding to different types of I/O interfaces.

4. The processor package module of claim 2, wherein the socket includes electrical contacts dedicated to the plurality of I/O links corresponding to different types of I/O interfaces, but the electrical contacts are inactive.

5. The processor package module of claim 2, wherein electrical power and ground contacts are located in an area of the socket located directly beneath the one or more compute die.

6. The processor package module of claim 2, wherein the electrical power and ground contacts are in an area of the socket located below the one or more compute die and the one or more photonic die.

7. The processor package module of claim 1, wherein the one or more photonic die each include optical ports.

8. The processor package module of claim 7, wherein the optical ports are on a bottom of the one or more photonic die.

9. The processor package module of claim 7, wherein the optical ports are on a top or an edge of the one or more photonic die.

10. The processor package module of claim 1, wherein the socket comprises a land grid array (LGA) socket.

11. A processor chip complex, comprising:
    a processor board; and
    a plurality of processor package modules mounted to the processor board, ones of the processor package modules comprising:
        a substrate;
        one or more compute die mounted to a first side of the substrate;
        one or more photonic die mounted to the first side of the substrate, the one or more photonic die having N optical I/O links to transmit and receive optical I/O signals using a plurality of virtual optical channels, the N optical I/O links corresponding to different types of I/O interfaces, excluding power and ground I/O, wherein the plurality of virtual optical channels of the N optical I/O links corresponding to different types of I/O interfaces transmit optical I/O signals for the compute die for any combination of memory signals, storage signals, accelerator signals, system management signals, boot signals, and display signals; and
        a socket onto which a second side of the substrate is mounted, the socket mounting a corresponding one of the processor package modules to a front side of the processor board, the socket supporting only the power and ground I/O and electrical connections between the one or more compute die and the one or more photonic die.

12. The processor chip complex of claim 11, wherein the socket comprises a land grid array (LGA) socket.

13. The processor chip complex of claim 11, wherein the one or more photonic die includes a first set of optical ports and the processor board includes embedded optical links and a second set of optical ports located on an edge of the processor board to pass the optical I/O signals from the socket to the edge of the processor board.

14. The processor chip complex of claim 11, wherein the optical I/O links are relayed from the processor board across multiple sets of optical ports to remote optically connected I/O devices.

15. The processor chip complex of claim 14, wherein the remote optically connected I/O devices include any combination of a memory device, a storage device, an accelerator device, a system management controller, and a system boot device.

16. The processor chip complex of claim 14, wherein the optical I/O links relayed to the remote optically connected I/O devices are dedicated to one of the socket, a server or a rack.

17. The processor chip complex of claim 14, wherein the optical I/O links relayed to the remote optically connected I/O devices are shared between multiple servers.

18. The processor chip complex of claim 11, further comprising an optical switch between the processor package modules and sets of optical ports located on an edge of the processor board.

19. A method of fabricating a processor chip complex, the method comprising:
    fabricating a plurality of processor package modules using standard assembly processes, where ones of the processor package modules comprise one or more compute die and one or more photonic die both mounted to a first side of a substrate;
    mounting the plurality of the processor package modules into respective LGA sockets;
    testing the plurality of the processor package modules to provide pretested processor package modules;
    mounting the pretested processor package modules to a processor board using the LGA sockets, and supplying power to each of the pretested processor package modules through the LGA sockets; and optically connecting N optical I/O links corresponding to different types of I/O interfaces from a first set of optical ports on the photonic die of each of the processor package modules to a corresponding second set of optical ports on an edge of the processor board, wherein the N optical I/O links corresponding to the different types of I/O interfaces transmit optical I/O signals for the photonic die of each of the processor package modules for any combination of memory signals, storage signals, accelerator signals, system management signals, boot signals, and display signals.

20. The method of claim 19, further comprising testing the processor chip complex.

21. The method of claim 19, further comprising before or after testing, making optical fiber connections between the second set of optical ports on the edge of the processor board to remote I/O devices external to the processor chip complex.

22. The method of claim 19, further comprising sharing the N optical I/O links relayed to remote I/O devices between multiple servers.

* * * * *